United States Patent

Warwick et al.

(10) Patent No.: US 8,848,385 B2
(45) Date of Patent: Sep. 30, 2014

(54) EMBEDDED ISOLATION FILTER

(75) Inventors: Thomas P. Warwick, Melbourne, FL (US); James V. Russell, Whitehouse Station, NJ (US)

(73) Assignee: R&D Sockets, Inc, Allentown, PA (US)

( * ) Notice: Subject to any disclaimer, the term of this patent is extended or adjusted under 35 U.S.C. 154(b) by 191 days.

(21) Appl. No.: 13/200,672

(22) Filed: Sep. 28, 2011

(65) Prior Publication Data

US 2012/0081867 A1    Apr. 5, 2012

Related U.S. Application Data

(60) Provisional application No. 61/404,521, filed on Oct. 5, 2010.

(51) Int. Cl.
*H05K 1/18*  (2006.01)
*H05K 1/02*  (2006.01)
*H05K 1/11*  (2006.01)

(52) U.S. Cl.
CPC .............. *H05K 1/0233* (2013.01); *H05K 1/185* (2013.01); *H05K 2201/10636* (2013.01); *H05K 1/113* (2013.01); *H05K 2201/1053* (2013.01)
USPC ........... 361/761; 361/760; 361/763; 361/766; 455/78; 455/82; 455/83; 333/12; 333/181; 333/185; 333/204; 333/246; 336/200

(58) Field of Classification Search
USPC ........ 361/761, 760, 763, 766; 455/78, 82, 83; 333/12, 181, 185, 204, 246; 336/200
See application file for complete search history.

(56) References Cited

U.S. PATENT DOCUMENTS

| | | | | |
|---|---|---|---|---|
| 5,603,847 | A  * | 2/1997 | Howard et al. | 216/17 |
| 5,708,569 | A  * | 1/1998 | Howard et al. | 361/760 |
| 6,091,310 | A  * | 7/2000 | Utsumi et al. | 333/12 |
| 6,456,172 | B1* | 9/2002 | Ishizaki et al. | 333/133 |
| 2002/0068530 | A1* | 6/2002 | Li | 455/82 |
| 2002/0130737 | A1* | 9/2002 | Hreish et al. | 333/204 |
| 2002/0137471 | A1* | 9/2002 | Satoh et al. | 455/83 |
| 2003/0080835 | A1* | 5/2003 | Hreish et al. | 333/246 |
| 2006/0017152 | A1* | 1/2006 | White et al. | 257/700 |
| 2007/0210866 | A1* | 9/2007 | Sato et al. | 330/126 |
| 2007/0257761 | A1* | 11/2007 | Mano et al. | 336/200 |
| 2009/0152739 | A1* | 6/2009 | Rofougaran et al. | 257/778 |
| 2009/0224849 | A1* | 9/2009 | Lee et al. | 333/185 |
| 2009/0224863 | A1* | 9/2009 | Mano et al. | 336/200 |
| 2009/0225525 | A1* | 9/2009 | Mano et al. | 361/760 |
| 2010/0117779 | A1* | 5/2010 | Mano et al. | 336/200 |
| 2010/0178879 | A1* | 7/2010 | Sato et al. | 455/78 |
| 2011/0029036 | A1* | 2/2011 | Yamamoto et al. | 607/36 |

* cited by examiner

*Primary Examiner* — Xiaoliang Chen
(74) *Attorney, Agent, or Firm* — Richard B Klar; Law Office Richard B Klar

(57) ABSTRACT

The present disclosure relates to reducing unwanted RF noise in a printed circuit board (PCB) containing an RF device. An isolation filter is embedded in a PCB containing an RDF device. By placing the isolation filter as close as possible to the RF device in order to dramatically reduce unwanted RF noise due to unavoidable coupling between Vias and planes in the PCB structure.

10 Claims, 4 Drawing Sheets

Embedded Isolation Filter

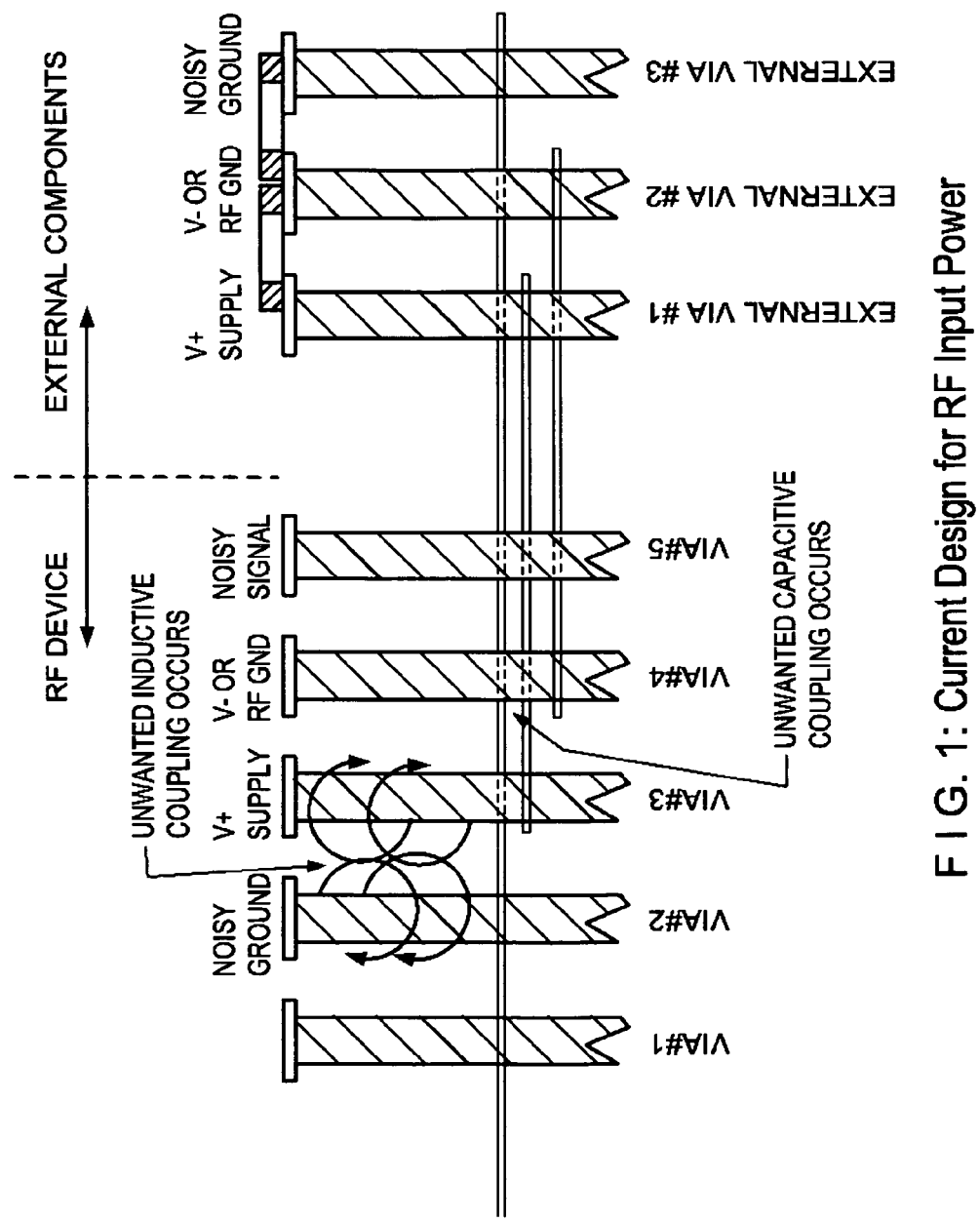
FIG. 1: Current Design for RF Input Power

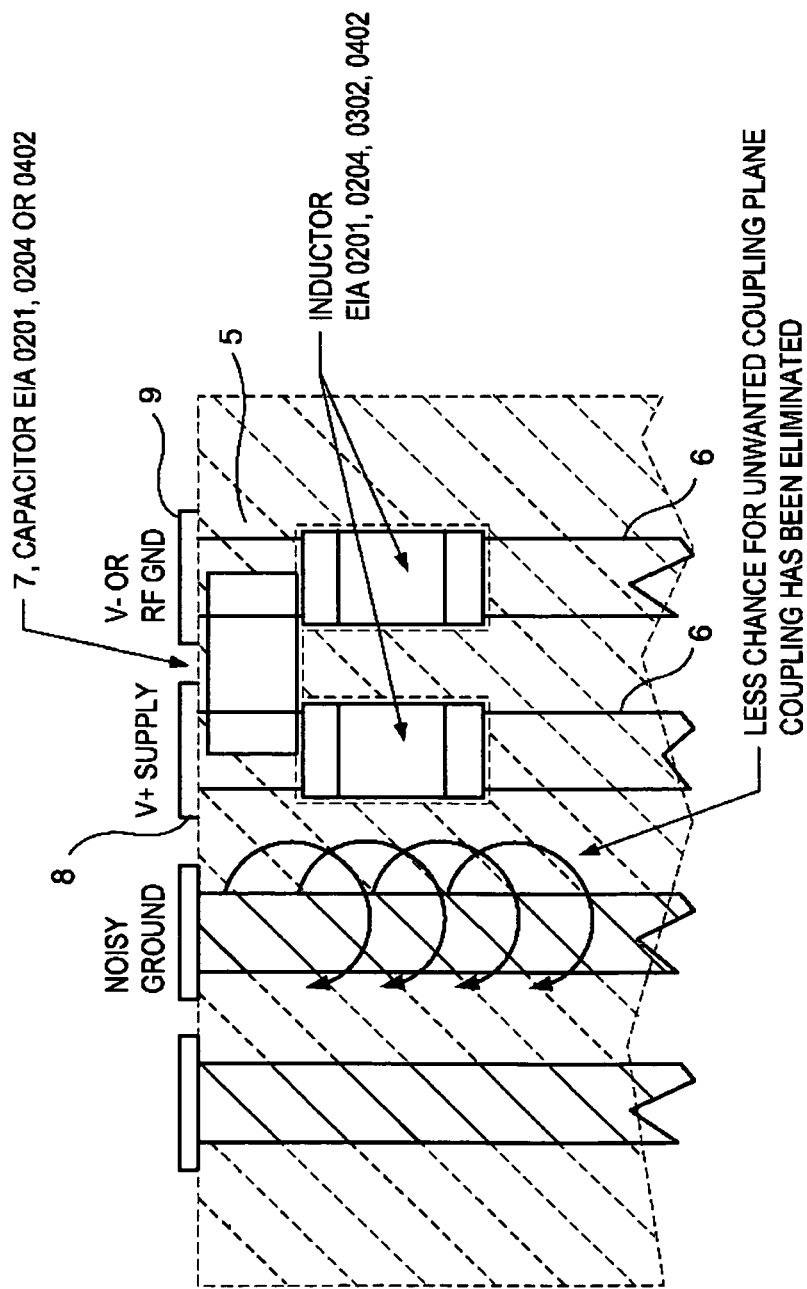
FIG. 2: Embedded Isolation Filter

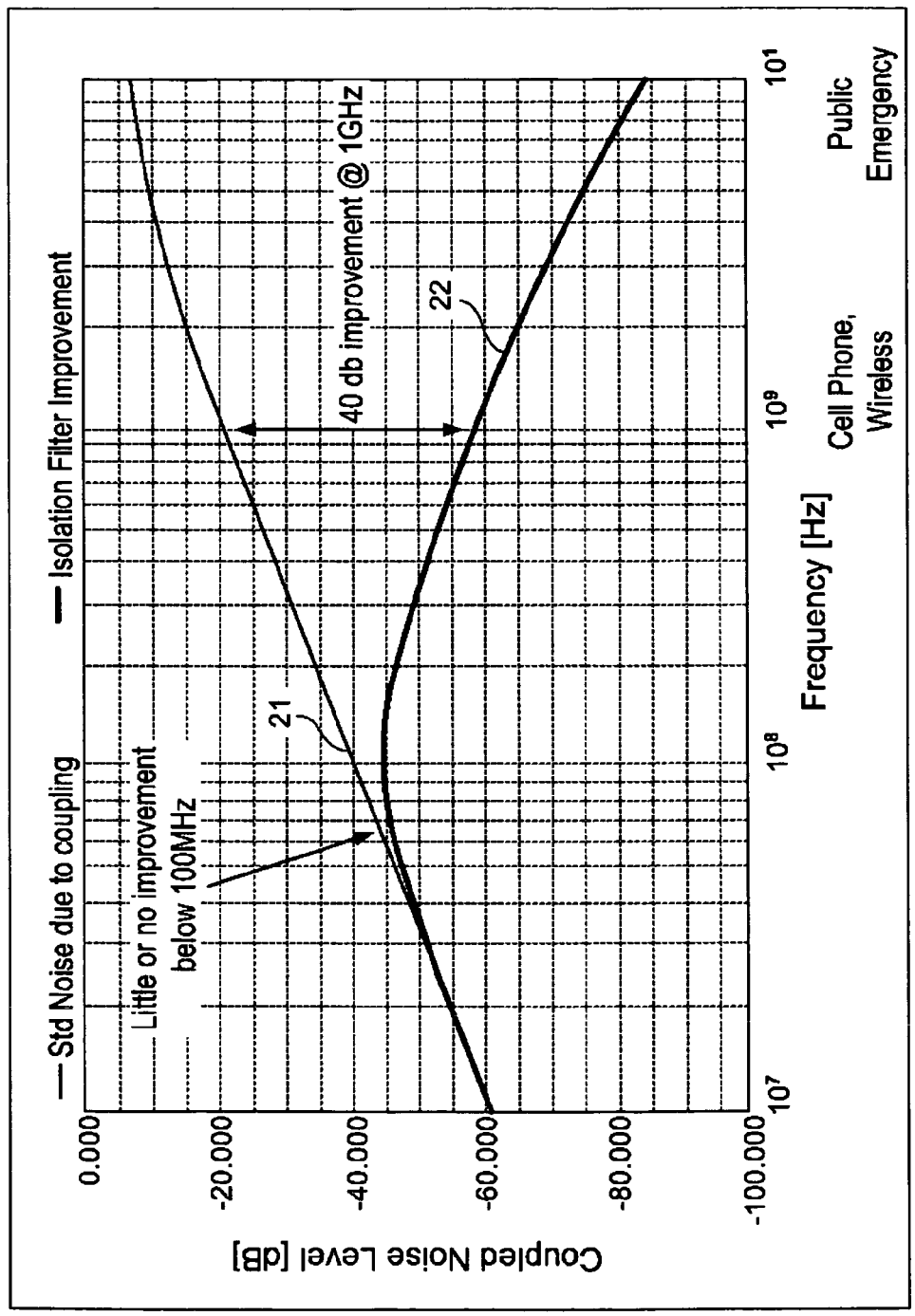
F I G. 3: Bode Plot of Isolation Filter Noise Improvement

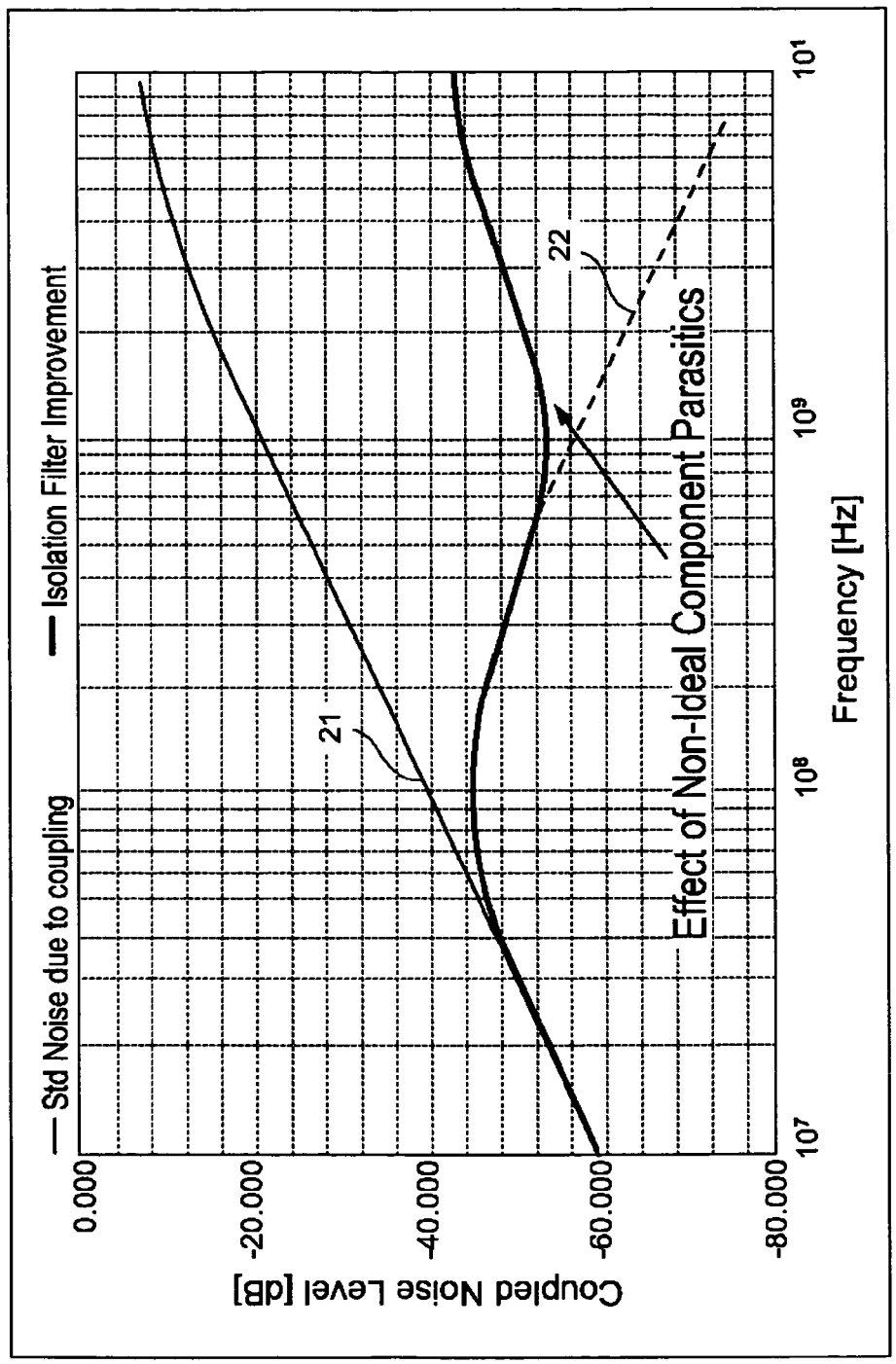
F I G. 4: Bode Plot of Isolation Filter Noise Improvement with Non-ideal Components

EMBEDDED ISOLATION FILTER

RELATED APPLICATIONS

This is a nonprovisional application of a provisional application Ser. No. 61/404,521 by James V. Russell and Thomas P. Warwick filed Oct. 5, 2010.

BACKGROUND

1. Field

The present disclosure relates to a method and an apparatus for an embedded isolation filter. In particular the present discourse provides for a method and an apparatus for an embedded isolation filter embodied in a printed circuit board (PCB). As noted, applicant's previously filed patent application Ser. No. 12/655,834 when attaching an electrical component to the bottom side and/or the top side of a printed circuit board (PCB), there is the problem of power loss due to the distance of the capacitance to the points on a corresponding IC for which it is intended. It is not possible to physically locate the capacitance directly to the contact pads on the printed circuit, which corresponds to the input output points of an integrated circuit or, in the case of a test board, the corresponding points of the test socket. Similarly, there is the problem of inadequate power dissipation due to the distance of a resistance to the electrical component. Again, it is not very likely to physically locate the resistance at the contact pads on the printed circuit board. Applicant's previous patent application Ser. No. 12,655,834 addresses this problem by providing a solution for attaching and embedding a capacitance or a resistance directly to an adaptor board or an interposer board that is then connected to the main circuit board. The adaptor board could then be connected to the main circuit board by soldering, electrically connecting it by a conductive elastomer connection, spring pins or by any other way that is known in the art. There is a need however to provide for an embedded isolation filter notably that can be used in analog and RF applications. An embedded isolation filter can also have broader uses such as reducing noise coupling on RF supplies without adding board spaces.

2. The Related Art

RF input designs commonly set RF gain by drawing a small DC current from the DC power supply to the RF transistor circuit. This allows the RF supply to be have a relatively higher impedance than, for example, its digital counterpart. It also aids printed circuit board layout, as it is very difficult to maintain an extremely low impedance so close to the RF device.

However, the DC current biasing the RF input design is very susceptible to interfering noise. This is depicted in FIG. 1. In FIG. 1, the RF device interfaces to the 5 Vias on the left. Via #3 and #4 are the DC supplies for the RF circuit. If Via #2, for example, is noisy due to much higher currents, it has the opportunity to couple into the RF supply pin. Such noisy higher currents are commonly generated in RF devices from, for example, phased locked loops. Components to remove the noise must be located some distance away, as shown on external Vias #1-#3. The components—often two inductors and one capacitor—form a noise reduction filter for DC bias currents known as an isolation filter.

As the connection pin pitch of such RF devices gets smaller, this problem worsens, simply due to greater proximity to the noisy nodes. This higher density also forces boards to be thicker, which results in much longer Vias. Such longer Vias have more coupling potential.

When such noise couples on an RF supply, it creates an unwanted modulation between the desired input signal and whatever noise couples into the device. This unwanted modulation can have several negative effects, such as inter-modulation distortion (e.g. measurements IP2, IP3), baseband signal to noise distortion, baseband integrated noise, and noise figure. The end result is that the RF receiver does not perform as well.

SUMMARY

The present disclosure provides for attaching and embedding an isolation filter directly to an adaptor board or an interposer board containing an RDF device that is then connected to the main circuit board. The adaptor board can be connected to the main circuit board by soldering, electrically connecting it by a conductive elastomer connection, spring pins or by any other way that is known in the art.

In addition, the present disclosure provides for an embedded isolation filter to mitigate the unwanted, uncoupled noise. This isolation filter is placed as physically close as possible to the actual RF device using embedded technology as disclosed in applicant's co-pending U.S. patent application Ser. No. 12/655,834 which is directly and substantially incorporated in its entirety by reference herein. As a result, there is a dramatic reduction in the opportunity for unwanted coupling from the long noisy Vias or due to a long run on a plane. The common isolation filter is constructed with two buried inductors sitting vertically in the PCB and one capacitor sitting horizontally across the RF supply pin and RF ground return pin. The isolation filter forms a simple LC "pi" ($\pi$) filter.

BRIEF DESCRIPTION OF THE DRAWINGS

FIG. 1 illustrates the fall back problems associated with the prior art proposals;

FIG. 2. illustrates the isolation filter of the present disclosure;

FIG. 3 is a Bode Plot illustrating the improvement of the embedded isolation filter of the present disclosure; and FIG. 4 is a Bode plot showing the Isolation Filter noise improvement with Non-Ideal Components.

DETAILED DESCRIPTION OF THE PREFERRED EMBODIMENT(S)

Referring to the drawings, FIG. 2 shows an isolation filters in accordance with the present disclosure for mitigating unwanted, coupled noise by placing this isolation filter as physically close as possible to the actual RF device on the PCB. This dramatically reduces the opportunity for unwanted coupling due to the long noisy Via or a long run on a plane. The common isolation filter as shown in FIG. 2 is preferably built with two buried inductors 6 sitting vertically in the printed circuit board and one capacitor 7 sitting horizontally across the RF supply pin 8 and the RF ground return pin 9. The filter forms a simple LC "pi" ($\pi$) filter—the most common form of isolation filter.

FIG. 3 shows a Bode Plot demonstrating the improvement of the embedded isolation filter of the present disclosure. Each data trace shows a relative (normalized) coupling to an adjacent noise source. As is the case with noise coupling, the data trace (existing methods) marked by "+" increases with frequency 21. The data trace showing the improvement of the isolation filter also increases with frequency until ~100 MHz. At that point, however, the noise starts to decrease 22. At 1 GHz, the isolation filter is ~40 db below the existing method.

That is, it is 40 db (or 100 times) "quieter" than the standard method. As frequency increase, so does the noise improvement (as long as parasitic don't affect the filter).

The point of decrease represents the resonant point of the isolation filter and can be adjusted by changing component values. In this example case, the component values of 10 nh, 10 h, and 100 pf resulted in a resonant point of 112.6 MHz. Any given value combination can be embedded. Larger values result in physically larger components, and this can be limited by the pitch of the device. Larger components are not always beneficial for higher frequency applications due to non-ideal parasitic properties. In practical terms the isolation filter resonant point may be as low as 1 MHz and as high as 3 GHz. For cell band and wireless applications, the filter chosen is very practical and maintains ~30 db noise reduction throughout the cell and wireless band region (see FIG. 4).

While certain embodiments have been shown and described, it is distinctly understood that the invention is not limited thereto but may be otherwise embodied within the scope of the appended claims.

The invention claimed is:

1. A method for reducing unwanted RF noise in a printed circuit board (PCB) containing an RF device, the steps comprising:

Embedding an isolation filter in a PCB containing an RDF device by placing the isolation filter as close as possible to the RF device in order to dramatically reduce unwanted RF noise due to unavoidable coupling between Vias and planes in the PCB structure by embedding said isolation filter inside of at least one PCB between vias of said at PCB, said isolation filter having terminals in an electrical contact with a pad of said at least PCB, said pad having a defined conductive elastomer thereon so that electricity conducts through said isolation filter to place said isolation filter close to said RF device to dramatically reduce unwanted RF noise due to unavoidable coupling between vias and planes in the PCB structure.

2. The method according to claim 1 further comprising building said isolation filter as at least a three component filter.

3. The method according to claim 2 wherein said at least a three component filter is formed of two buried inductors located vertically in said PCB and one capacitor located horizontally across an RF supply pin and an RF ground return pin to form a simple LC "pi" ($\pi$) filter.

4. An improved printed circuit board (PCB) containing an RF device with reduced unwanted RF noise comprising:

an isolation filter embedded in a PCB containing an RDF device wherein the isolation filter is placed as close as possible to the RF device in order to dramatically reduce unwanted RF noise due to unavoidable coupling between vias and planes in the PCB structure, said isolation filter being embedded inside of at least PCB between vias of said at least one PCB, said isolation filter having terminals in an electrical contact with a pad of said at least one adaptor board, said pad having a defined isotropic conductive elastomer thereon so that electricity conducts through said isolation filter to place said isolation filter close to said RF device to dramatically reduce unwanted RF noise due to unavoidable coupling between vias and planes in the PCB structure.

5. The improved PCB according to claim 4 further comprising said isolation filter is formed as at least a three component filter.

6. The Improved PCB according to claim 5 wherein said at least a three component filter is formed of two buried inductors located vertically in said PCB and one capacitor located horizontally across an RF supply pin and an RF ground return pin to form a simple LC "pi" ($\pi$) filter.

7. The method according to claim 1 wherein said pad defined conductive elastomer is an isotropic elastomer.

8. The method according to claim 1 wherein said pad defined conductive elastomer is an anisotropic elastomer.

9. The improved PCB according to claim 4 wherein said pad defined conductive elastomer is an isotropic elastomer.

10. The improved PCB according to claim 4 wherein said pad defined conductive elastomer is an anisotropic elastomer.

* * * * *